United States Patent [19]

Hayashi

[11] Patent Number: 5,365,191
[45] Date of Patent: Nov. 15, 1994

[54] OFFSET REDUCING CIRCUIT FOR DIFFERENTIAL AMPLIFIER

[75] Inventor: Shigeyoshi Hayashi, Kyoto, Japan

[73] Assignee: Rohm Co., Ld., Kyoto, Japan

[21] Appl. No.: 935,552

[22] Filed: Aug. 26, 1992

[51] Int. Cl.$^5$ .............................................. H03F 3/45
[52] U.S. Cl. ................................................. 330/252
[58] Field of Search ..................... 330/9, 261, 253, 69, 330/252, 295, 151; 307/261

[56] References Cited

U.S. PATENT DOCUMENTS

| 4,390,848 | 6/1983 | Blauschild | 330/151 |
| 4,430,622 | 2/1984 | Simoes | 330/9 |
| 4,543,538 | 9/1985 | Fay | 330/260 |
| 4,760,286 | 7/1988 | Pigott | 307/261 |
| 4,808,942 | 2/1989 | Milkovic | 330/9 |
| 4,881,044 | 11/1989 | Kinoshita et al. | 330/253 |
| 5,047,727 | 9/1991 | Theus | 330/9 |
| 5,124,663 | 6/1992 | McEntrfer et al. | 330/9 |
| 5,164,176 | 9/1992 | Evans | 330/69 |
| 5,220,288 | 6/1993 | Brooks | 330/261 |

FOREIGN PATENT DOCUMENTS

| 61-264806 | 11/1986 | Japan | 330/9 |
| 62-272605 | 11/1987 | Japan | 330/9 |
| 63-260206 | 10/1988 | Japan | 330/9 |

Primary Examiner—Raymond A. Nelli
Attorney, Agent, or Firm—Brumbaugh, Graves, Donohue & Raymond

[57] ABSTRACT

A differential amplifier includes a differential couple in which emitters of a pair of transistors are connected by a resistor. A voltage difference between bases or emitters of the transistors is detected, and a current responding to the voltage difference is fed back to the differential couple from a current canceling circuit to cancel a current which causes the voltage difference. As a result, an offset generated between inputs of a differential amplifier due to differences between constant currents is reduced.

6 Claims, 6 Drawing Sheets

5,365,191

OFFSET REDUCING CIRCUIT FOR DIFFERENTIAL AMPLIFIER

BACKGROUND OF THE INVENTION

The present invention relates to an offset reducing circuit for a differential amplifier used in driving circuits, such as a CD driver.

Conventionally, a simple operational amplifier as shown in FIG. 9 is employed as a driving circuit such as a CD driver. In the operational amplifier, a differential amplifier 2 is arranged at front end portion. In this case, in the differential amplifier 2, a differential couple 24 is provided in which a resistor 23 connects between emitters of transistors 21 and 22. Constant current sources 25 and 26 are connected to the emitters of the transistors 21 and 22. Namely, in this differential amplifier 2, operational currents are supplied to the transistors 21 and 22 by drawing a constant current I into the constant current sources 25 and 26. At collector side of the transistor 21 and 22, a current mirror circuit 27 is arranged as an active load of the differential couple 24. In other words, a transistor 28 of which base and collector are commonly connected (namely diode connection) is connected between the collector of the transistor 21 and a power source Vcc, while a transistor 29 is connected between the collector of the transistor 22 and the power source Vcc.

In this differential amplifier 2, a transistor 6 is provided to constitute a feeds back loop 4 which feedback an output of the differential couple 24 from the collector of the transistor 29 into the base of the transistor 22. The transistor 6 is connected between the power source and the base of the transistor 22. A base of the transistor 6 is connected to the collector of the transistor 22. A constant current source 8 is connected between the base of the transistor 22 and a reference potential point (grounding point) so that a constant current flowing from the transistor 6 is drawn into the constant current source 8.

In such operational amplifier, when an input signal is applied via a input terminal 10, the input signal is amplified by the differential amplifier 2. The amplified output is applied to the base of the transistor 6 through the transistor 29 of the current mirror circuit 27 to output from an output terminal 12 according to the relationship with the constant current being drawn into the constant current source 8. At the same time, a part of the output current is fed back to the base of the transistor 22. The above mentioned differential amplifier 2 using the differential couple in which emitters are connected by the resistor 23 is frequently used in the case of where it is not necessary to match an amplifier gain by increasing a slew rate by raising the constant current.

In the above-mentioned differential amplifier 2, the constant current may vary due to differences in the transistors which constitute the constant current sources 25 and 26 by reason of the IC manufacturing process. Why the offset can occur will be explained. To simplify the explanation, as shown in FIG. 10A, the feedback loop 4 is simplized, and the transistors 21, 22, 28 and 29 are assumed to be ideal transistors. In the drawing, the transistor 28 is indicated as a diode, but it is a transistor of which the base and the emitter are commonly connected to constitute a current mirror circuit 27 as same as the differential circuit 27 shown in FIG. 9. In this differential amplifier 2, it is assumed that the collector current of the transistor 21 is reversed at the current mirror circuit to cause the current to flow to the collector side of the transistor 22, since the currents of transistors 21, 22, 28, and 29 must be equal so as to balance the currents of the current mirror circuit 27. If the collector currents of the transistors 21 and 22 are represented by $I_{c1}$ and $I_{c2}$, an equation $I_{c1}=I_{c2}$ is established. In the case of where the constant current I of the constant current source 25 is increased by $\Delta I$, an equation $I_{e1}=I_{e2}$ is established from the equation $I_{c1}=I_{c2}$. Where $I_{e1}$ and $I_{e2}$ are emitter currents of the transistors 21 and 22. Therefore, the emitter currents $I_{e1}$ and $I_{e2}$ are expressed by $I_{e1}=I_{e2}=I+\Delta I/2$. Accordingly, a current flowing through the resistor 23 becomes $\Delta I/2$. If a resistance of the resistor 23 is indicated by R, a voltage $(R\times \Delta I/2)$ is generated across the resistor 23, that is, between the emitters of the transistors 21 and 22 due to the voltage drop expressed by a product of the current flowing the resistor 23 by the resistance of the resistor 23. According to the equations $I_{c1}=I_{c2}$ and $I_{e1}=I_{e2}$, an offset voltage $\Delta V$ $(=R\times \Delta I/2)$ is produced between a base of the transistor 22 and a base of transistor 21 which is the same as the voltage $(=R\times \Delta I/2)$ between the emitters of the transistors 21 and 22.

In the case where the feedback loop is disconnected and the bases of the transistors 21 and 22 are grounded in the differential amplifier 2 as shown in FIG. 10B, currents flowing through the transistors 21 and 22 are current values detected at the emitter side. A current flowing through the resistor 23 is exponentially compressed according to the voltage difference of the diode 28. Therefore, if the current difference $\Delta I$ of the constant current I is small, the current flowing through the resistor 23 can be negligible.

However, as shown in FIG. 10A, since a current due to the current difference $\Delta I$ is fed back to the base side of the transistor 22 via the feedback loop 4, $I_{c1}=I_{c2}$ is established by the feedback operation of $\Delta I=0$. Then, the constant currents $I+\Delta I$ and I are equally distributed as currents $I+\Delta I/2$ to the transistors 21 and 22. As a result, an offset voltage is generated.

SUMMARY OF THE INVENTION

Therefore, an object of the invention is to provide an offset reducing circuit for a differential amplifier, which reduces an offset appearing between inputs of the differential amplifier due to differences in constant currents flowing to a differential couple of the differential amplifier.

According to the present invention, an offset reducing circuit for a differential amplifier, comprises a differential amplifier having a differential couple in which a resistor connects between emitters of a pair of transistors (first and second transistors); and a current canceling circuit for detecting a voltage difference between bases of the transistors of the differential amplifier and for supplying a current corresponding to the voltage difference into the differential couple to cancel a current which causes the voltage difference.

Furthermore, according to the present invention, an offset reducing circuit for a differential amplifier comprises a differential amplifier having a differential couple in which a resistor connects between emitters of a pair of transistors (first and second transistors); and a current canceling circuit for detecting a voltage difference between the emitters of the transistors of the differential amplifier and for supplying a current corresponding to the voltage difference into the differential couple to cancel a current which causes the voltage difference.

In the case where constant currents flowing from constant current sources distinctly connected to the transistors of the differential couple are uneven, the voltage difference responsive to the unevenness is generated across the resistor connecting between the emitters of the transistors of the differential couple. This voltage difference appears between bases of the transistors as an offset.

The current canceling circuit detects the voltage difference between the bases of the transistors which constitute the differential couple, and supplies a current responsive to the voltage difference to the differential couple so as to cancel a current which causes the voltage difference. In this way, the offset generated in the differential amplifier is reduced.

Furthermore, the canceling circuit detects the voltage difference between the emitters of the transistors which constitute the differential couple, and supplies a current responding to the voltage difference to the differential couple so as to cancel a current which causes the voltage difference. In this way, the offset of the differential amplifier is reduced.

DESCRIPTION OF PREFERRED EMBODIMENTS

Figure 1:
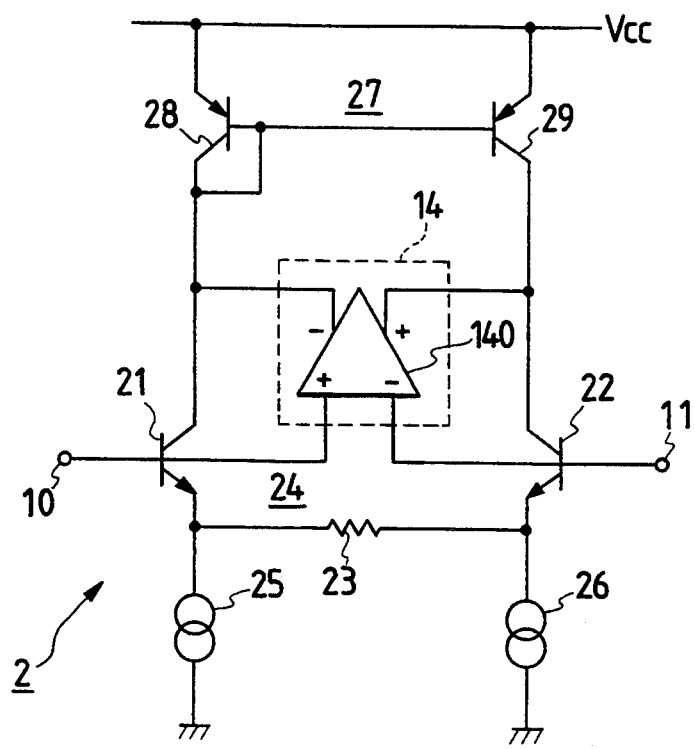
FIG. 1 is a circuit diagram showing a first embodiment of an offset reducing circuit of the differential amplifier of the present invention.

FIG. 1 shows an embodiment of an offset reducing circuit for a differential amplifier 2 according to the present invention. In this differential amplifier 2, a pair of a first and second transistors 21 and 22 are provided, emitters of which are connected by a resistor 23 so that a differential couple is constituted. The resistor 23 serves as a gain setting means for the differential amplifier 2, so a desired gain is obtained according to a resistance of the resistor 23.

Constant current sources 25 and 26 are distinctly connected between emitter sides of the transistors 21 and 22 and a reference potential point (grounding point) to apply operating currents to the transistors 21 and 22 by the constant currents. At the collector side of the transistor 21 and 22, a current mirror circuit 27 is connected as a active load of the differential couple 24. This current mirror circuit 27 is constituted by a transistor 28, the base and collector of which are commonly connected to form a diode and a transistor 29, the base of which is connected to the base and collector of the transistor 28. Accordingly, the differential amplifier 2 amplifies an input signal from input terminals 10 and 11 at the base side of the transistors 21 and 22, and outputs an amplified signal at the collector side of the transistor 29.

In this differential amplifier 2, a current canceling circuit 14 is provided to cancel a current which causes an offset generated across the resistor 23 due to differences between the constant currents of the constant current sources 25 and 26. In the current canceling circuit 14, a control amplifier 140 is used, in which a positive phase input terminal is connected to the base of the transistor 21 and a reversal phase input terminal is connected to the base of the transistor 22, so that a voltage difference between the bases is detected by the control amplifier 140. The control amplifier 140 produces a current responding to the voltage difference, and supplies a positive phase output to a collector side of the transistor 22 and supplies a reversal phase output to a collector side of the transistor 21 in a reversal relationship of the detection of the voltage reference so that a current which causes the voltage difference is canceled.

Figure 2:
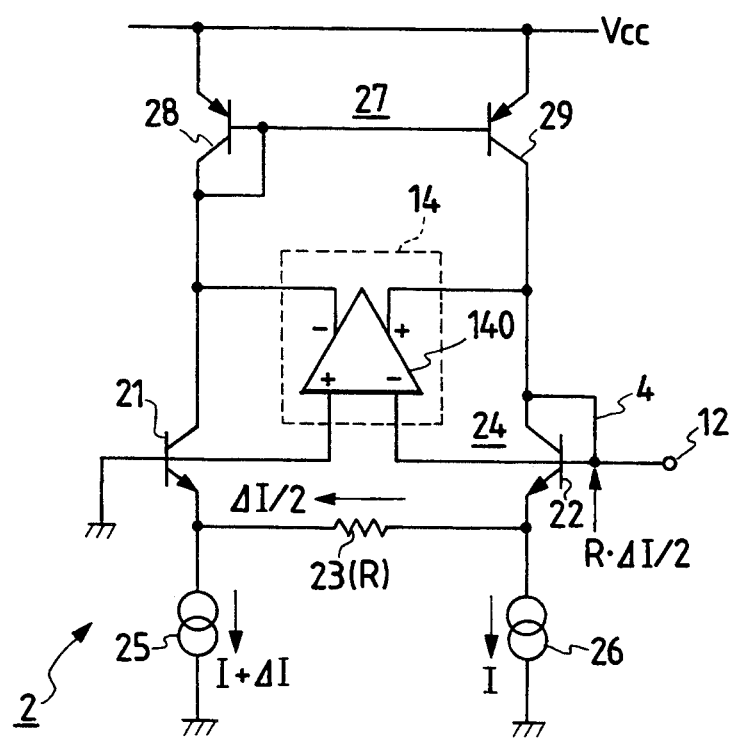
FIG. 2 is a circuit diagram for explanation of operation of the offset reducing circuit of the differential amplifier shown in FIG. 1.

Operation of the differential amplifier 2 having the current canceling circuit 14 shown in FIG. 1 is explained with reference to a differential circuit shown in FIG. 2. In the differential amplifier 2 shown in FIG. 2, the base of the transistor 21 is grounded, a feedback loop 4 is formed between the base and collector of the transistor 22, and an output terminal 12 is formed at the base of the transistor 22. A differential input/differential current output type of the differential amplifier is employed as the control amplifier 140. If a positive phase input and a reversal phase input are represented by Vi(+) and Vi(−), respectively, then a positive phase output current Io(+) and a reversal phase output current Io(−) are represented as follow.

$$Io(+) = k\{Vi(+) - Vi(-)\} \tag{1}$$

$$Io(-) = -k\{Vi(+) - Vi(-)\} \tag{2}$$

Where k is a converting gain coefficient for converting a differential input voltage difference of the control amplifier 140 into the output current.

If constant currents of the constant current sources 25 and 26 is expressed by $I + \Delta I$ and I, in the case of that the control amplifier 140 is not provided, the voltage generated across the resistor 23 is $R \times \Delta I/2$. Alternatively, in the case of where the control amplifier is connected, the control amplifier 140 outputs the output currents expressed as follow.

$$Io(+) = k(-R \cdot \Delta I/2) = -k \cdot R \cdot \Delta I/2 \tag{3}$$

$$Io(-) = -k(-R \cdot \Delta I/2) = k \cdot R \cdot \Delta I/2 \tag{4}$$

That is, a reversal phase current $-k \cdot R \cdot \Delta I/2$ flows into the positive phase output current $Io(+)$ and a positive current $k \cdot R \cdot \Delta I/2$ flows into the reversal phase output current $Io(-)$. When these output currents are fed back to the differential couple 24, a current from the transistor 29 is represented by $I + \Delta I/2 - k \cdot R \cdot \Delta I/2$, and a current from transistor 28 is represented by $I + \Delta I/2 + k \cdot R \cdot \Delta I/2$. Since these currents are feedback by the fed back loop 4, the input and output currents of the differential amplifier are canceled so that the currents from the transistors 29 and 28 are balanced by $I + \Delta I/2$.

In this time, the collector currents $I_{c1}$ and $I_{c2}$ of the transistors 21 and 22 are represented by following equations.

$$I_{c1} = I + \Delta I/2 + k \cdot R \cdot \Delta I/2 \qquad (5)$$

$$I_{c2} = I + \Delta I/2 - k \cdot R \cdot \Delta I/2 \qquad (6)$$

It is assumed that the transistors 21 and 22 are ideal transistors. The emitter current $I_{e1}$ of the transistor 21 is equal to the collector current $I_{c1}$ and the emitter current $I_{e2}$ of the transistor 22 is equal to the collector current $I_{c2}$. Considering that the constant currents $I + \Delta I$ and I at the emitter side of the transistor 21 and 22 are divided into the emitter currents $I_{e1}$ and $I_{e2}$, a current $\Delta Ir$ between the emitters of the transistors 21 and 22 is expressed as follow.

$$\Delta Ir = \Delta I/2 - k \cdot R \cdot \Delta I/2 = \Delta I/2 \cdot (1 - k \cdot R) \qquad (7)$$

Accordingly, a voltage $\Delta Vr$ generated across terminals of a resistors 23 is expressed as follow.

$$\Delta Vr = R \cdot \Delta Ir = R \cdot \Delta I/2(1 - k \cdot R) \qquad (8)$$

As apparent form the above, the offset can be reduced relative to that in which no control amplifier 140 is provided. Particularly, in the equation (8), the constants K and R are set to establish $1 - k \cdot R = 0$, namely, $k = 1/R$, the voltage $\Delta Vr$ can be zero ($\Delta Vr = 0$).
In this time, no offset is generated.

The above explanation is established even if the control amplifier 140 is replaced by a simple differential amplifier. In such a case, the equations (1) and (2) representing the operation of the control amplifier 140 are modified as follow.

$$Io(+) = k\{Vi(+) - Vi(-)\} + q \qquad (9)$$

$$Io(-) = -k\{Vi(+) - Vi(-)\} + q \qquad (10)$$

The operation of canceling the voltage difference is carried out as same as the above-described manner.

Next, second embodiment of the offset reducing circuit for the differential amplifier is described with reference to FIG. 3. According to second embodiment of the present invention, the voltage difference generated at the resistor 23 is directly detected from the emitters of the transistors 21 and 22, while the voltage difference between the bases of the transistors 21 and 22 is detected as in the first embodiment. That is, in the current canceling circuit 14, the positive phase input of the control amplifier 140 is connected to the emitter of the transistor 21 and the reversal phase input of that is connected to the emitter of the transistor 22 to detect the voltage difference therebetween. The currents responding to the voltage difference are supplied to the transistors 21 and 22 to cancel a current which causes the voltage difference so that the offset is reduced. Specifically, a positive phase output current of the control amplifier 140 is supplied to the collector side of the transistor 22, while a reversal phase output current of that is supplied to the collector side of the transistor 21.

Figure 4:
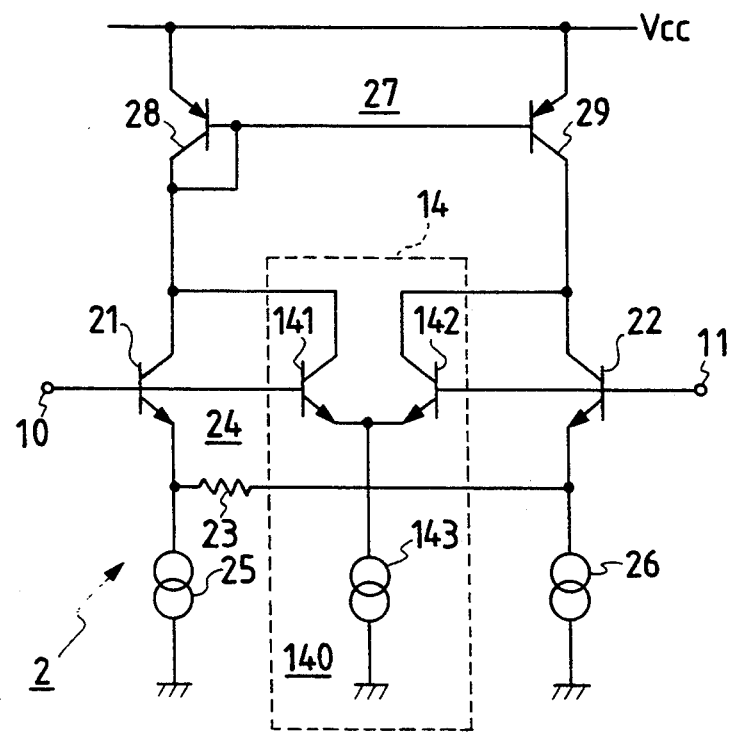
FIG. 4 is a circuit diagram showing a concrete arrangement of the offset reducing circuit shown in FIG. 1.

The specific circuit arrangements of the offset reducing circuit for the differential amplifier according to the present invention are shown in FIGS. 4 to 7. FIG. 4 is a concrete circuit diagram of the embodiment shown in FIG. 1. The control amplifier 140 is formed by a differential amplifier in which a differential couple made of transistor 141 and 142, emitters the of which are commonly connected, is connected to a constant current source 143. In other words, the bases of transistors 141 and 142 are connected to the bases of the transistors 21 and 22, respectively. Thus, the voltage difference between the bases of the transistors 21 and 22 is detected by the transistors 141 and 142, and a current responding to the detected voltage difference is drawn into the constant current source 143 from the collector side of the transistors 21 and 22 through the transistors 141 and 142, so that the differences in the currents of the constant current source 25 and 26 which causes the voltage difference across the resistor 23 is canceled to reduce the offset.

Figure 5:
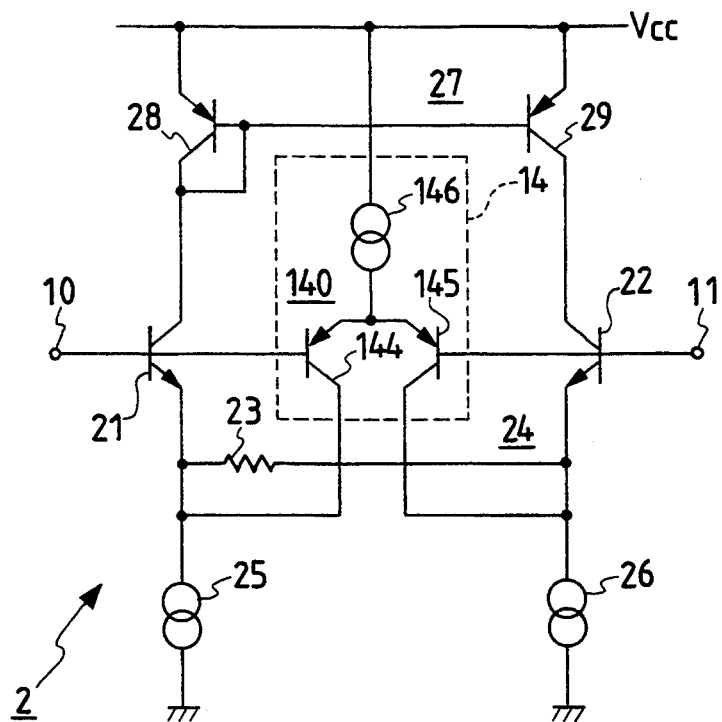
FIG. 5 is a circuit diagram showing a concrete arrangement of the offset reducing circuit shown in FIG. 1.

FIG. 5 is another concrete circuit diagram of the embodiment shown in FIG. 1. The control amplifier 140 is formed by a differential amplifier in which a constant current source 146 is connected between a differential couple made of PNP type transistors 144 and 145, the emitters of which are commonly connected, and a power source Vcc. In other words, the bases of transistors 144 and 145 are connected to the bases of the transistors 21 and 22, respectively. Thus, the voltage difference between the bases of the transistors 21 and 22 is detected by the transistors 144 and 145, and a current responding to the detected voltage difference is supplied from the constant current source 146 at the power source side to the emitter side of the transistor 21 through the transistors 144 and 145, so that the differences in the currents of the constant current sources 25 and 26 which causes the voltage difference across the resistor 23 is canceled to reduce the offset.

Figure 3:
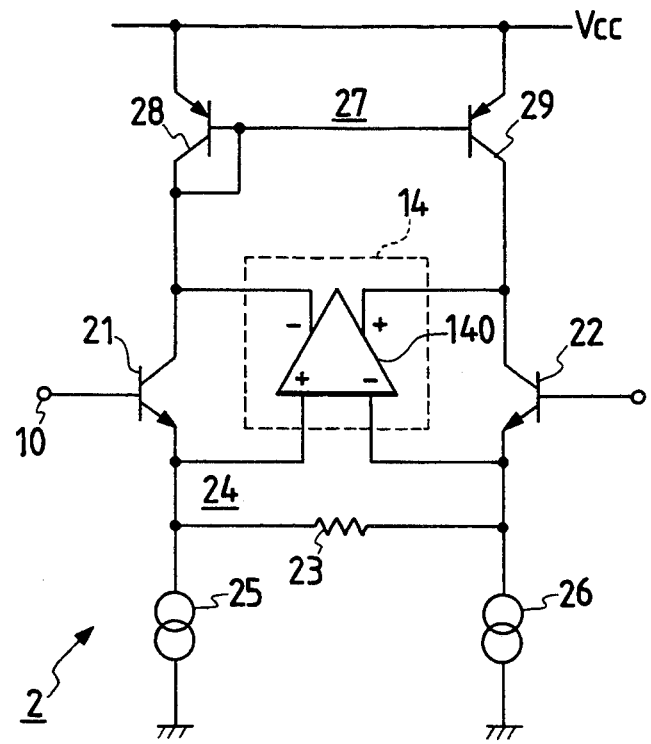
FIG. 3 is a circuit diagram showing a second embodiment of an offset reducing circuit of the differential amplifier of the present invention.
Figure 6:
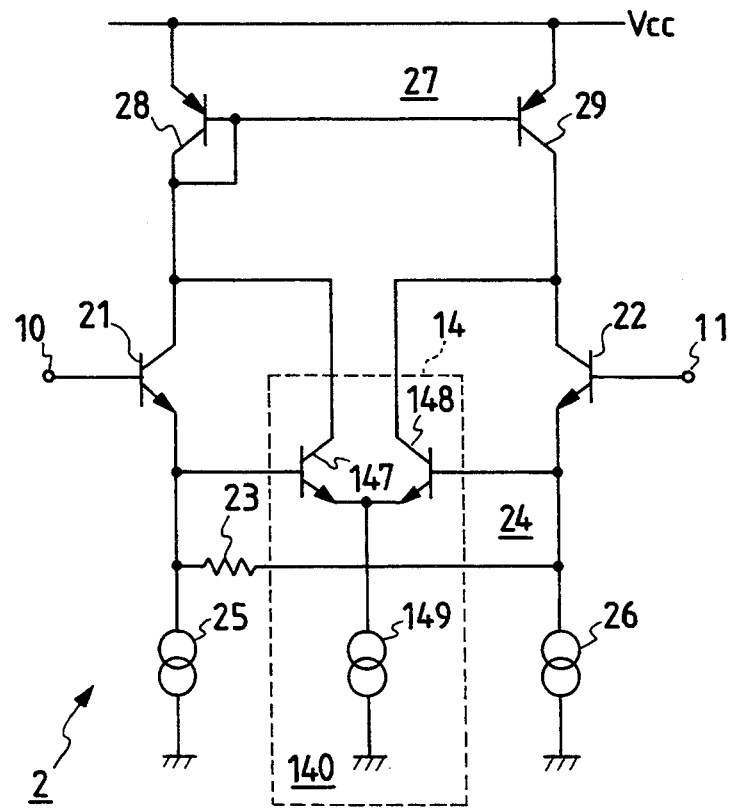
FIG. 6 is a circuit diagram showing a concrete arrangement of the offset reducing circuit shown in FIG. 6.

FIG. 6 is a concrete circuit diagram of the embodiment shown in FIG. 3. The control amplifier 140, formed by a differential amplifier in which a differential couple made of transistors 147 and 148, the emitters of which are commonly connected, is connected to a constant current source 149. In other words, the bases of the transistors 147 and 148 are connected to the emitters of the transistors 21 and 22, respectively. Thus, the voltage difference between the emitters of the transistors 21 and 22 is detected by the transistors 144 and 145, and a current responding to the detected voltage difference is drawn into the constant current source 149 thorough the transistors 147 and 148, so that the differences in the currents of the constant current sources 25 and 26 which causes the voltage difference across the resistor 23 is canceled to reduce the offset.

Figure 7:
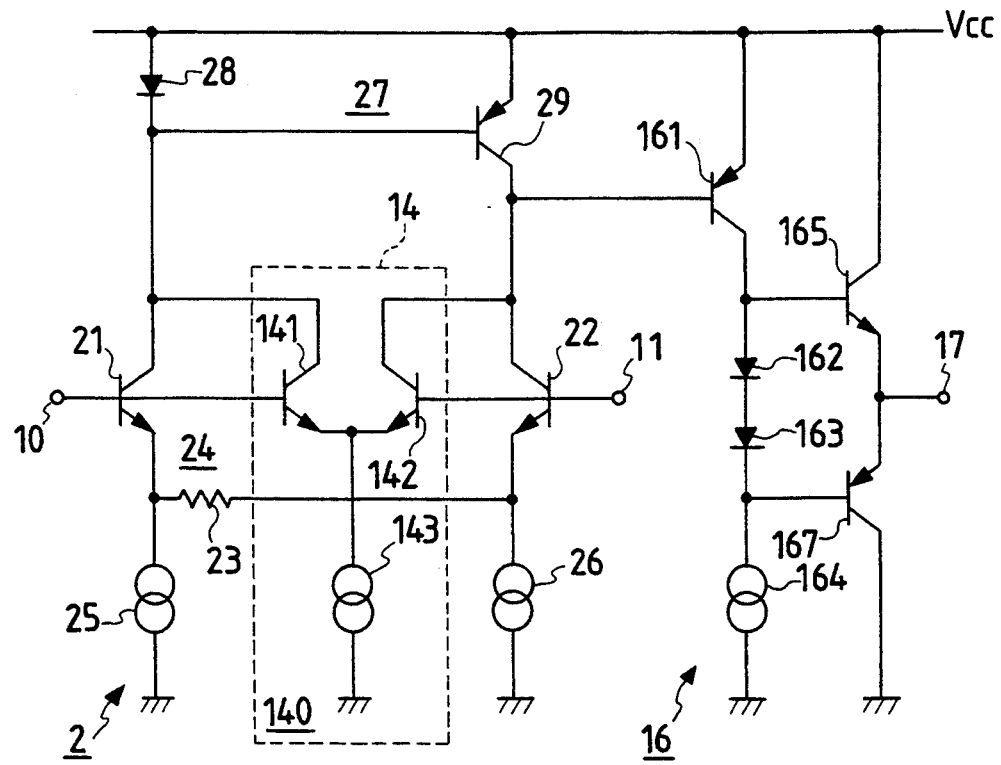
FIG. 7 is a circuit diagram showing an operational amplifier in which a offset reducing circuit of the present invention is applied.
Figure 9:
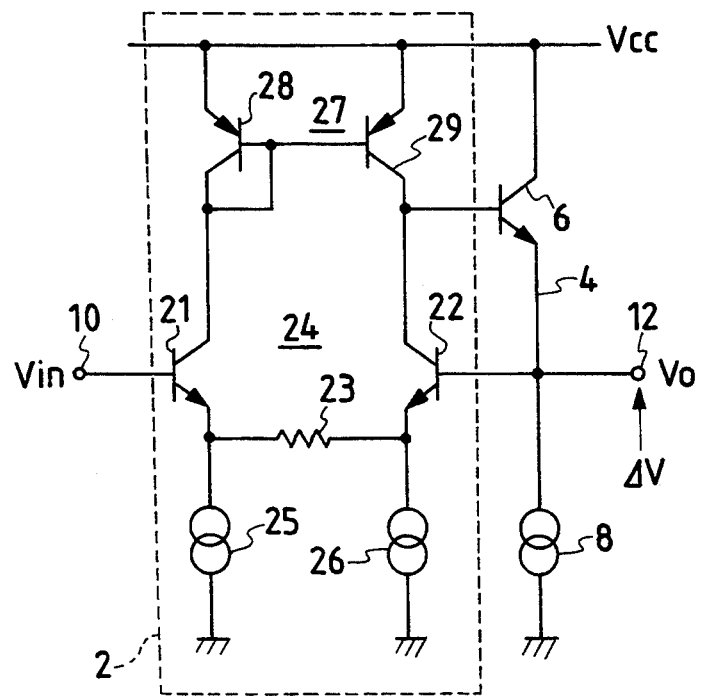
FIG. 9 is a circuit diagram showing an operational amplifier employing a conventional differential amplifier.

FIG. 7 is a concrete circuit diagram of the offset reducing circuit for the differential amplifier shown in FIG. 4. In this circuit, an output of the differential amplifier 2 is output from a collector of the transistor 29. And, the output of the differential amplifier 2 is supplied to the output circuit for amplifying the same. Namely, the collector of the transistor 29 is connected to the base of a transistor 161. When the transistor 22 is in a conductive state, the base current is drawn into transistor 22. At the collector side of the transistor 161, a constant current source 164 is serially connected via diodes 162 and 163 so that a current flowing through the transistor 161 is drawn into the constant current source 164 via the diodes 162 and 163. The collector of the transistor 161 is connected to a base of an output transistor 165, and the cathode of the diode 163 is connected to a base of an output transistor 167. The output transistors 165 and 167 are serially connected between the power source Vcc and the ground, and an output terminal 17 is formed at the emitter which is commonly connected.

In the operational amplifier, bias voltages of the output transistors 165 and 167 are determined based on the voltage appearing at the diodes 162 and 163 which is generated by a current from the transistor 161. The output transistors 165 and 167 are alternatively conducted by the output current of the transistor 161 so that an output is taken from the output terminal 17.

Figure 8:
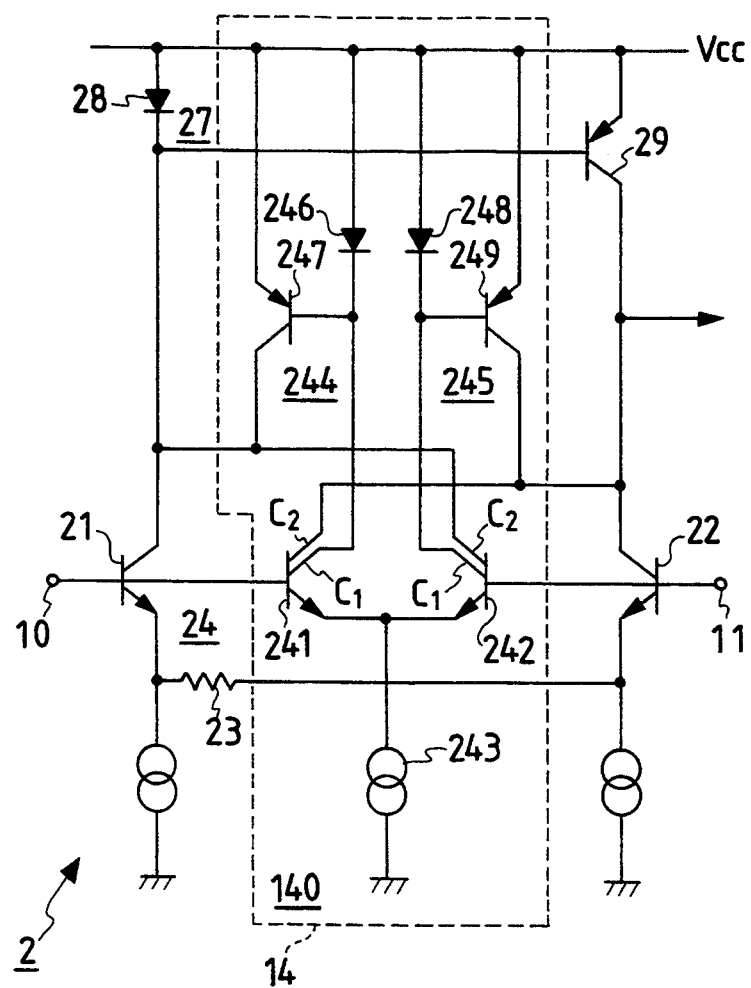
FIG. 8 is a circuit diagram showing a third embodiment of an offset reducing circuit of the differential amplifier of the present invention.
Figure 10A:
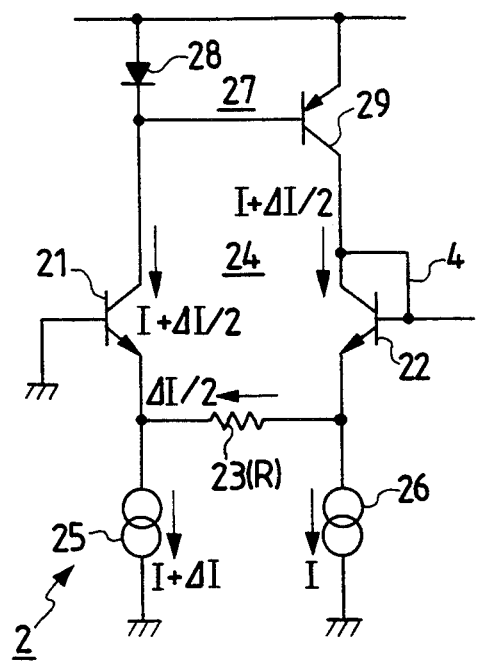
FIGS. 10A and 10B are circuit diagrams for explanation an offset generated in the differential amplifier shown in FIG. 9.
Figure 10B:
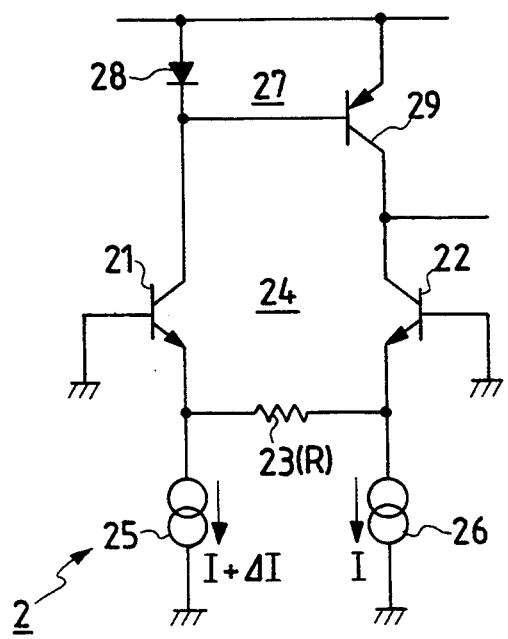

FIG. 8 shows a third embodiment of an offset reducing circuit for the differential amplifier according to the present invention. The current canceling circuit 14 has similar arrangement as shown in FIG. 4. A differential couple made of transistors 241 and 242, the emitters of which are commonly connected, is connected to a constant current source 243 to detect a voltage between the bases of the transistors 21 and 22. Multi-collector transistors are employed as the transistors 241 and 242 constituting the differential couple to reduce the offset current in the current canceling circuit 14. Each of the multi-collector transistor has two collectors. In this circuit, a first current mirror circuit 244 is arranged between a first collector c1 of the transistor 241 and a second collector c2 of the transistor 242, while a second current mirror circuit 245 is arranged between a first collector c1 of the transistor 242 and a second collector c2 of the transistor 241. The first current mirror 244 is formed by a diode 246 and a transistor 247, while the second current mirror is formed by a diode 248 and a transistor 249.

According to this arrangement, a collector current of the transistor 241 is supplied to the second collector c2 of the transistor 242 through the first collector c1 of the transistor 241 and the first current mirror circuit 244, while a collector current of the transistor 242 is supplied to the second collector c2 of the transistor 241 through the first collector c1 of the transistor 242 and the second current mirror circuit 245, so that the offset is generated between the bases of the transistors 241 and 242. Accordingly, in the case of such current canceling circuit is employed, it is possible to cancel the offset of the differential amplifier 2 with high accuracy, to achieve a amplifying gain control with a high reliability of the amplifier characteristics.

As described above, according to the present invention, it is possible to reduce the offset of a differential amplifier which is caused by differences between constant currents from constant current sources according to that differences. As a result, a reliability of input/output characteristics is improved, and the controllability of gain of the differential amplifier is also improved.

What is claimed is:

1. A voltage offset reducing circuit which reduces a voltage differential produced between two transistors of a differential amplifier, said voltage differential being produced by an imbalance in current supplied to a differential couple, comprising:
   a current mirror circuit disposed on a collector side of said two transistors of said differential amplifier, for supplying a current to one of said two transistors which corresponds to a current flowing through the other of said two transistors;
   a differential amplifier including a resistor connected between emitters of the two transistors to form said differential couple; and
   a current canceling circuit for detecting a voltage differential between bases of said two transistors, configured to supply a current responsive to said voltage differential to said differential amplifier, thus acting to cancel said current imbalance responsible for causing said voltage differential.

2. A voltage offset reducing circuit as claimed in claim 1, wherein said current canceling circuit comprises a control amplifier having a positive phase input terminal connected to the base of one of said two transistors, a reversal phase input terminal connected to the base of the other of said two transistors, a positive phase output connected to the collector of said other of said two transistors, and a reversal phase output connected to the collector of said one of said two transistors.

3. A voltage offset reducing circuit as claimed in claim 2, wherein said control amplifier comprises a differential couple having two further transistors, the emitters of which are connected to each other, and the bases of which constitute said positive and reversal phase input terminals, respectively, and the collectors of said two further transistors constituting said positive and reversal phase outputs, respectively.

4. A voltage offset reducing circuit which reduces a voltage differential produced between two transistors of a differential amplifier, said voltage differential being produced by an imbalance in current supplied to a differential couple, comprising:
   a current mirror circuit disposed on a collector side of said two transistors of said differential amplifier, for supplying a current to one of said two transistors which corresponds to a current flowing through the other of said two transistors;
   a differential amplifier including a resistor connected between emitters of the two transistors to form said differential couple; and
   a current canceling circuit for detecting a voltage differential between said emitters of said two transistors of said differential amplifier, configured to supply a current responsive to said voltage differential to said differential, thus acting to cancel said current imbalance responsible for causing said voltage differential.

5. A voltage offset reducing circuit as claimed in claim 4, wherein said current canceling circuit comprises a control amplifier having a positive phase input terminal connected to the emitter of one of said two transistors, a reversal phase input terminal connected to the emitter of the other of said the transistors, a positive phase output connected to the collector of said other of said two transistors, and a reversal phase output connected to the collector of said one of said two transistors.

6. A voltage offset reducing circuit as claimed in claim 5, wherein said control amplifier comprises a differential couple having two further transistors, the emitters of which are connected to each other, and the bases of which constitute said positive and reversal phase input terminals, respectively and the collectors of said two further transistors constituting said positive and reversal phase output, respectively.

* * * * *